US009524798B2

(12) United States Patent
Mandal

(10) Patent No.: US 9,524,798 B2
(45) Date of Patent: Dec. 20, 2016

(54) DATA SAMPLER CIRCUIT

(71) Applicant: STMicroelectronics International N.V., Amsterdam (NL)

(72) Inventor: Sajal Kumar Mandal, Distt. Howrah (IN)

(73) Assignee: STMICROELECTRONICS INTERNATIONAL N.V., Amsterdam (NL)

( * ) Notice: Subject to any disclaimer, the term of this patent is extended or adjusted under 35 U.S.C. 154(b) by 0 days.

(21) Appl. No.: 13/960,213

(22) Filed: Aug. 6, 2013

(65) Prior Publication Data

US 2015/0043681 A1 Feb. 12, 2015

(51) Int. Cl.
*G11C 27/02* (2006.01)
(52) U.S. Cl.
CPC .................................. *G11C 27/026* (2013.01)
(58) Field of Classification Search
CPC ..................... H03F 3/45183; H01L 2924/0002
See application file for complete search history.

(56) References Cited

U.S. PATENT DOCUMENTS

| 6,208,542 B1* | 3/2001 | Wang et al. ..................... 365/45 |
| 6,298,066 B1* | 10/2001 | Wettrot ................. H04L 12/403 370/449 |
| 7,362,153 B2* | 4/2008 | Sumesaglam ........ G11C 7/1078 327/202 |
| 7,893,766 B1* | 2/2011 | Cranford, Jr. ......... H03F 1/3211 330/258 |
| 2013/0076408 A1* | 3/2013 | Soe ........................ H03L 7/193 327/117 |

\* cited by examiner

*Primary Examiner* — Sibin Chen
(74) *Attorney, Agent, or Firm* — Gardere Wynne Sewell, LLP

(57) ABSTRACT

A circuit includes: a first circuit stage configured to sample a differential input signal at a first logic state of a sampling clock and regenerate the sampled differential input signal at a second logic state of the sampling clock to output a first regenerated differential signal; a second circuit stage configured to amplify the first regenerated differential signal at the second logic state of the sampling clock to output an amplified differential signal; and a third circuit stage configured to regenerate the amplified differential signal at the first logic state of the sampling clock to output a second regenerated differential signal.

29 Claims, 6 Drawing Sheets

DATA SAMPLER CIRCUIT

TECHNICAL FIELD

The present invention relates to data sampler circuits and, in particular, to a data sampler circuit suited to sample near the edges of a modulated data stream.

BACKGROUND

A differential data sampler is a circuit configured to receive low voltage swing differential data (for example, from a modulated data stream) at an input and generate full swing or amplified sampled data at an output. The circuit receives a clock signal used to control the sampling instant. In many instances it is important for the circuit to be able to correctly sample the differential data at both the center of the bit and near the bit boundary. However, sampling near the bit boundary can be challenging. One reason for this is that the received differential data may not be well behaved in terms of bit width and bit height. For example, bit width and/or height suppression may be applied against the differential data as the data signal propagates through a low pass transmission channel before being received and sampled. It is accordingly possible for the data sampler circuit, when sampling near the bit boundary, to incorrectly detect a low logic value for the data at a sampling instant where the data in fact has a high logic value (and vice versa).

There is a need in the art for a differential data sampler circuit that can address the foregoing and other problems.

SUMMARY

In an embodiment, a circuit comprises: a first circuit stage configured to sample a differential input signal at a first logic state of a sampling clock and regenerate the sampled differential input signal at a second logic state of the sampling clock to output a first regenerated differential signal; a second circuit stage configured to amplify the first regenerated differential signal at the second logic state of the sampling clock to output an amplified differential signal; and a third circuit stage configured to regenerate the amplified differential signal at the first logic state of the sampling clock to output a second regenerated differential signal.

In an embodiment, a method comprises: sampling a differential input signal at a first logic state of a sampling clock; regenerating the sampled differential input signal at a second logic state of the sampling clock to output a first regenerated differential signal; amplifying the first regenerated differential signal at the second logic state of the sampling clock to output an amplified differential signal; and regenerating the amplified differential signal at the first logic state of the sampling clock to output a second regenerated differential signal.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
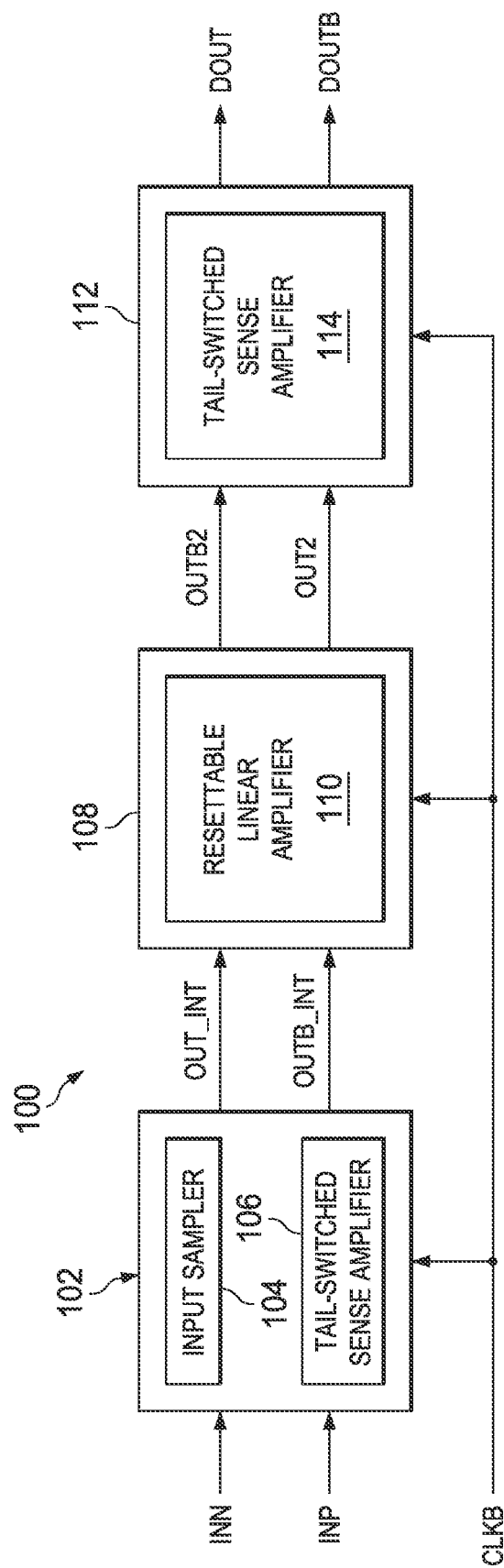
FIG. 1 is a block diagram of a differential data sampler circuit.

Reference is now made to FIG. 1 which illustrates a block diagram of a differential data sampler circuit 100. The circuit 100 is implemented with a three-stage design. The first stage 102 comprises an input sampling switch circuit 104 with a tail-switched sense amplifier circuit 106. The tail switching operation and input sampling operation are both controlled by a received sampling clock CLKB. The second stage 108 comprises a resettable linear amplifier circuit 110. The resetting of the linear amplifier circuit is controlled by the received sampling clock CLKB. The third stage 112 comprises a tail-switched sense amplifier circuit 114. The tail switching operation is controlled by the received sampling clock CLKB. The first, second and third stages 102, 108 and 112 are connected in series.

A differential data signal (for example, a low voltage swing differential data signal such as a modulated data stream) is received at differential inputs INN and INP of the first stage 102. The voltages at the differential inputs INN and INP are sampled and saved by the input sampling switch circuit 104 at a pair of capacitive sampling nodes in response to a first logic state (for example, logic high) of the sampling clock CLKB. The tail-switched sense amplifier circuit 106 is deactivated by that first logic state of the sampling clock CLKB. The sampling clock CLKB then changes to a second logic state (for example, logic low). The tail-switched sense amplifier circuit 106 is activated by the second logic state of the sampling clock CLKB to amplify the sampled voltages at the differential inputs INN and INP and generate corresponding intermediate differential output signals OUT_INT and OUTB_INT. The intermediate differential output signals OUT_INT and OUTB_INT are amplified in the second stage 108 by the linear amplifier 110 to generate intermediate differential output signals OUTB2 and OUT2, respectively. The linear amplifier 110 is activated by the second logic state of the sampling clock CLKB and reset by the first logic stage of the sampling clock CLKB. The sampling clock CLKB then changes back to the first logic state. The intermediate differential output signals OUTB2 and OUT2 are received by the third stage 112. The tail-switched sense amplifier circuit 114 is activated by the first logic state of the sampling clock CLKB to amplify the intermediate differential output signals OUTB2 and OUT2 and generate corresponding differential output signals DOUT and DOUTB, respectively.

Figure 2A:
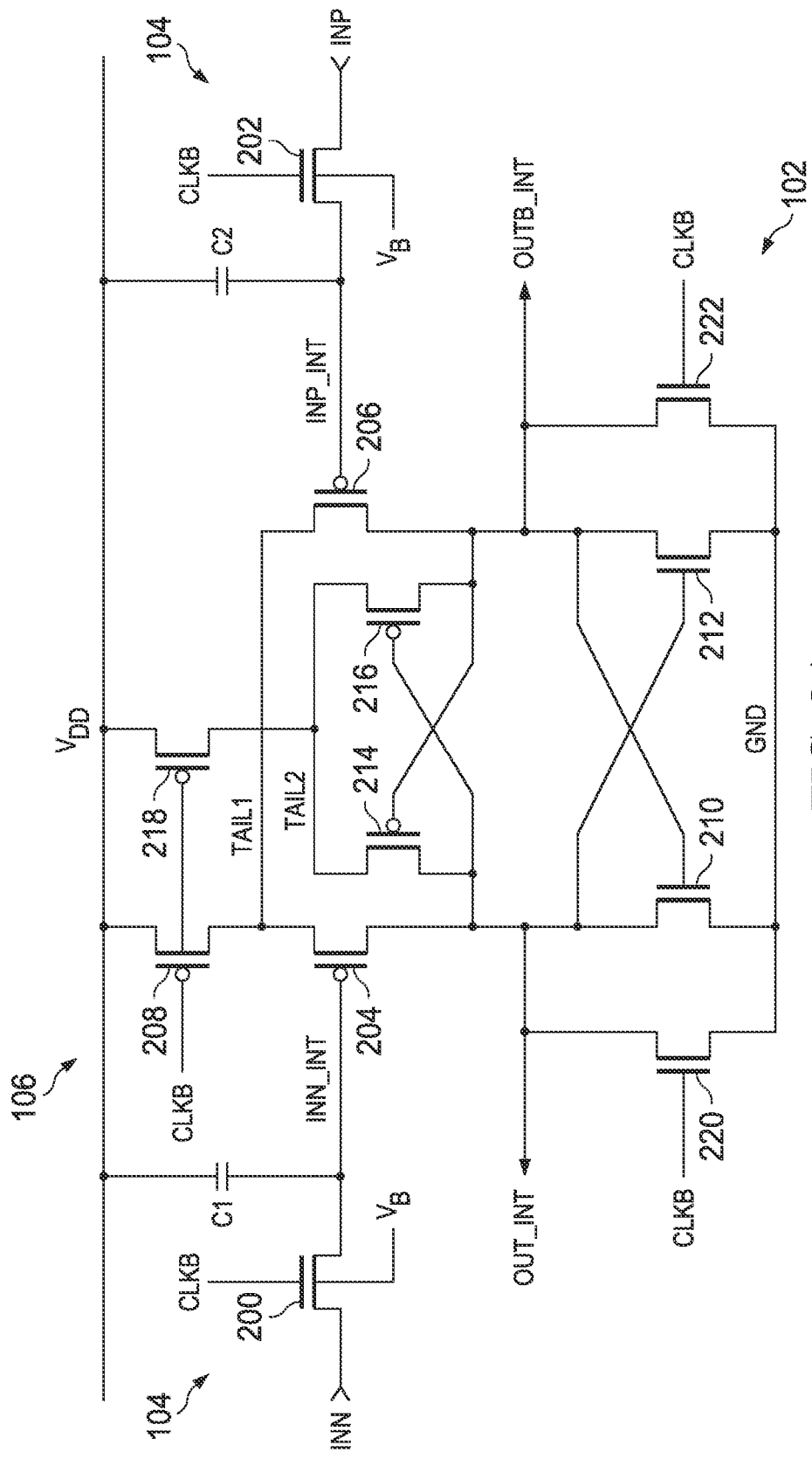
FIG. 2A is a circuit diagram of an exemplary embodiment of the first stage of the differential data sampler circuit of FIG. 1.

Reference is now made to FIG. 2A which presents a circuit diagram of an exemplary embodiment of the first stage 102 of the differential data sampler circuit 100 of FIG. 1.

The input sampling switch circuit 104 of the first stage 102 includes a first pass gate transistor 200 and a second pass gate transistor 202. The first and second pass gate transistors 200 and 202 are NMOS transistors. A source terminal of the first pass gate transistor 200 is coupled to an input node configured to receive the negative input signal (INN) of the input differential data signal. A drain terminal of the first pass gate transistor 200 is coupled a first plate of a first capacitor C1. A second plate of the first capacitor C1 is coupled to a first voltage supply node (for example, VDD). A source terminal of the second pass gate transistor 202 is coupled to an input node configured to receive the positive input signal (INP) of the input differential data signal. A drain terminal of the second pass gate transistor 202 is coupled a first plate of a second capacitor C2. A second plate of the second capacitor C2 is coupled to the first voltage supply node (VDD). The gate terminals of the first and second pass gate transistors 200 and 202 are coupled to receive the sampling clock CLKB signal. In response to a first logic state (logic high) of the sampling clock CLKB, the first and second pass gate transistors 200 and 202 are turned on and the voltages at the differential inputs INN and INP of input differential data signal are sampled onto the first and second capacitors C1 and C2, respectively, as the sampled intermediate signals INN_INT and INP_INT.

Figure 2B:
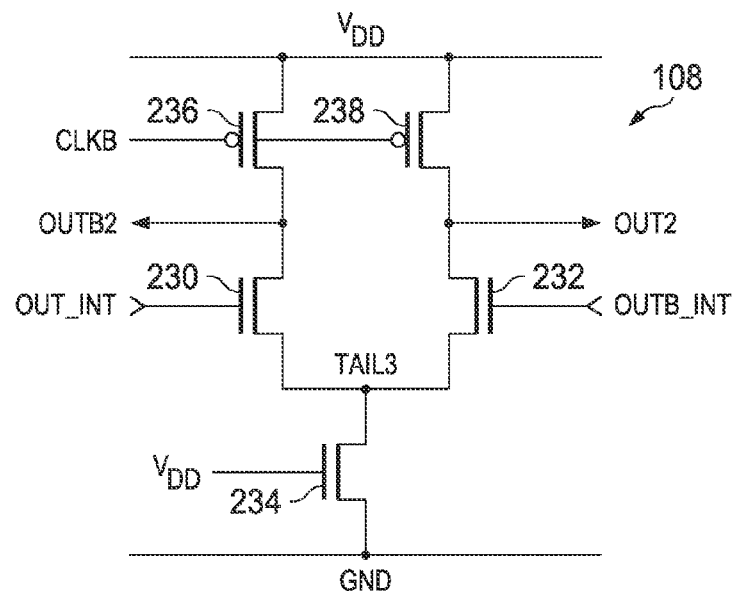
FIG. 2B is a circuit diagram of an exemplary embodiment of the second stage of the differential data sampler circuit of FIG. 1.
Figure 2C:
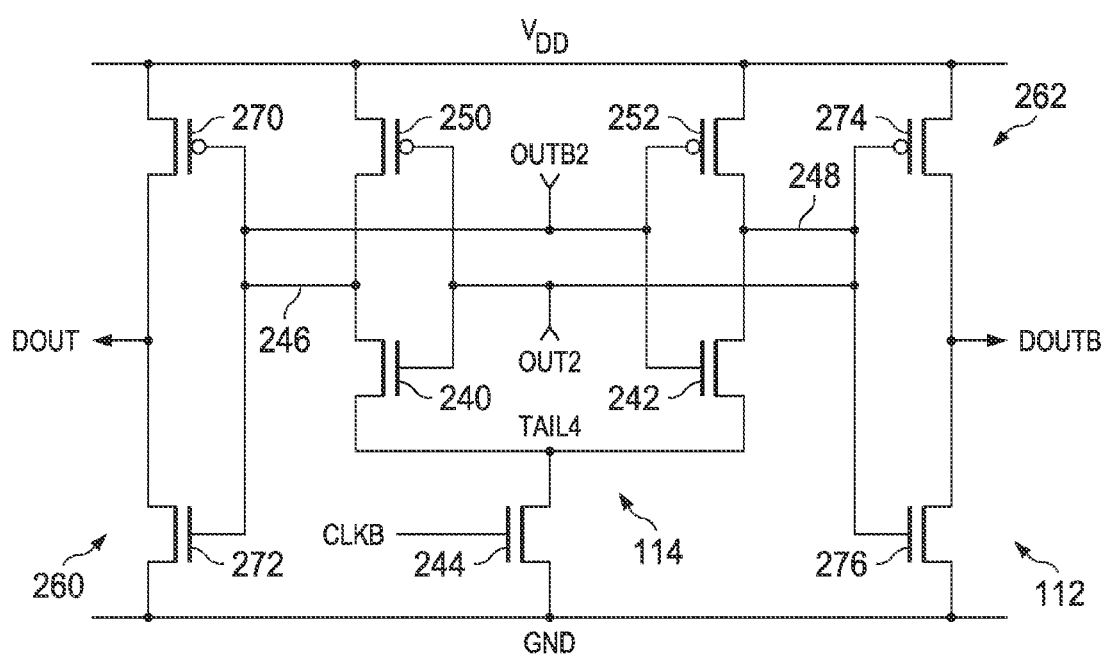
FIG. 2C is a circuit diagram of an exemplary embodiment of the third stage of the differential data sampler circuit of FIG. 1.
Figure 2D:
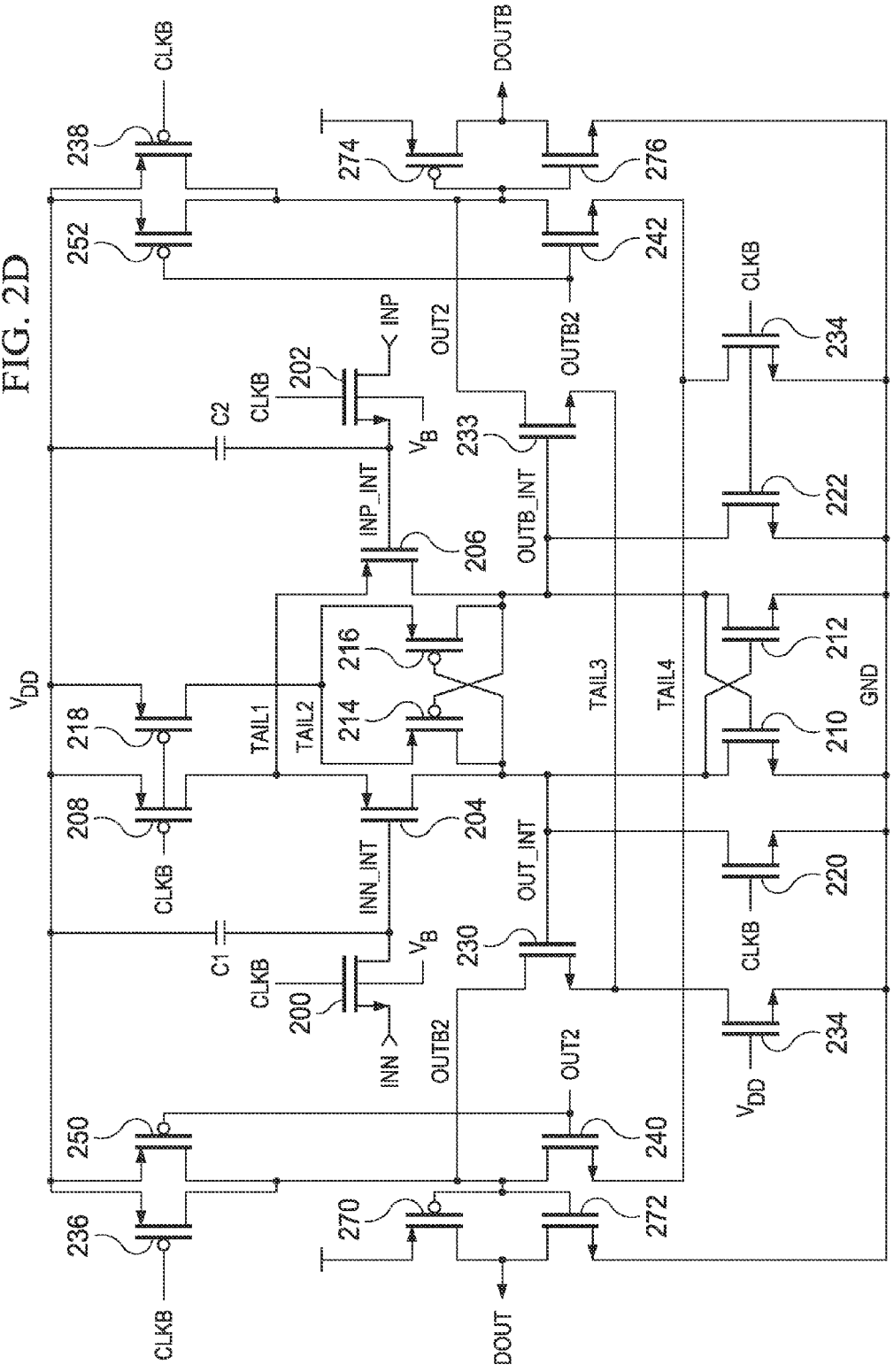
FIG. 2D is a circuit diagram illustrating the connection of the circuits of FIGS. 2A-2C.
Figure 2E:
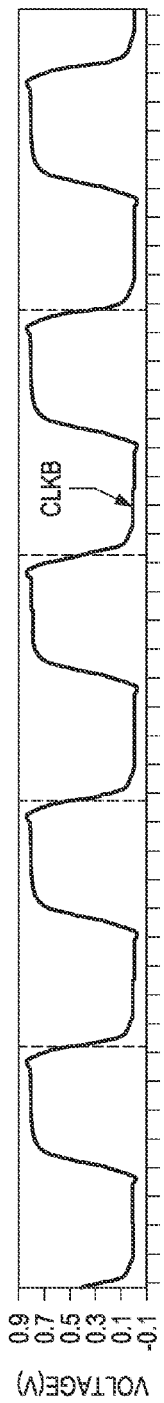
FIG. 2E is a circuit diagram of a bias generating circuit.

In a preferred implementation, the bodies of the first and second pass gate transistors 200 and 202 are fed with an input common mode voltage VB tapped from a mid-point NB of a differential termination circuit as shown in FIG. 2E. A first termination resistor R1 is connected to receive the negative input signal (INN) of the input differential data signal. A second termination resistor R2 is connected to receive the positive input signal (INP) of the input differential data signal. The resistors R1 and R2 have equal resistances, and in a preferred implementation that resistance is 50 ohms. The two resistors R1 and R2 are connected in series at a mid-point node NB. A capacitor C3 is connected between the node NB and a second voltage supply node (for example, ground). The common mode voltage VB is generated at the node NB. That common mode voltage VB is sampled by a switching circuit SW1 and stored on a bias capacitor Cb that is coupled to the bodies of the first and second pass gate transistors 200 and 202. At this time, switch SW2 remains open. If VB needs to be connected to second supply voltage (GND) then SW1 is made open and SW2 is closed. This body biasing improves the speed of sampling of the first and second pass gate transistors 200 and 202 by reducing the threshold voltage of the transistors.

Reference is once again made to FIG. 2A. The tail-switched sense amplifier circuit 106 of the first stage 102 includes a first input transistor 204 and a second input transistor 206. The first and second input transistors 204 and 206 are PMOS transistors. The source terminals of the first and second input transistors 204 and 206 are coupled together at a common tail node TAIL1. A first tail node transistor 208 is coupled between the common tail node TAIL1 and the first voltage supply node (VDD). The first and second input transistors 204 and 206 form a differential input pair of transistors for a differential amplifier circuit. A gate of the first input transistor 204 is coupled to receive the sampled intermediate signal INN_INT. The drain terminal of the first input transistor 204 is coupled to an output node of the differential amplifier circuit to produce the intermediate differential output signal OUT_INT. A gate of the second input transistor 206 is coupled to receive the sampled intermediate signal INP_INT. The drain terminal of the second input transistor 206 is coupled to an output node of the differential amplifier circuit to produce the intermediate differential output signal OUTB_INT.

The differential amplifier circuit further includes a first pair of cross-coupled transistors 210 and 212. The transistors 210 and 212 are NMOS transistors. A drain of a first transistor 210 is coupled to the drain terminal of the first input transistor 204, and a drain of a second transistor 212 is coupled to the drain terminal of the second input transistor 206. The source terminals of the transistors 210 and 212 are coupled to the second voltage supply node (ground). A gate terminal of the first transistor 210 is coupled to the drain terminal of the second transistor 212. Conversely, a gate terminal of the second transistor 212 is coupled to the drain terminal of the first transistor 210.

The differential amplifier circuit still further includes a second pair of cross-coupled transistors 214 and 216. The transistors 214 and 216 are PMOS transistors. A drain of a first transistor 214 is coupled to the drain terminal of the first input transistor 204, and a drain of a second transistor 216 is coupled to the drain terminal of the second input transistor 206. The source terminals of the transistors 214 and 216 are coupled together at a common tail node TAIL2. A second tail node transistor 218 is coupled between the common tail node TAIL2 and the first voltage supply node (VDD). A gate terminal of the first transistor 214 is coupled to the drain terminal of the second transistor 216. Conversely, a gate terminal of the second transistor 216 is coupled to the drain terminal of the first transistor 214.

The gate terminals of the first and second tail transistors 208 and 218 are coupled to receive the sampling clock CLKB signal.

The tail-switched sense amplifier circuit 106 of the first stage 102 further includes a first clamping transistor 220 coupled between the output node of the differential amplifier circuit for the intermediate differential output signal OUT_INT and the second voltage supply node (ground) and a second clamping transistor 222 coupled between the output node of the differential amplifier circuit for the intermediate differential output signal OUTB_INT and the second voltage supply node (ground). The source terminals of the first and second clamping transistors 220 and 222 are coupled to the second voltage supply node, while the drain terminals are coupled, respectively, to the OUT_INT and OUTB_INT signal output nodes of the second stage 102. The gate terminals of the first and second clamping transistors 220 and 222 are coupled to receive the sampling clock CLKB signal.

In response to the first logic state (logic high) of the sampling clock CLKB, the first and second clamping transistors 220 and 222 are turned on and the voltages at the OUT_INT and OUTB_INT signal output nodes are clamped to the second voltage supply node (ground). Additionally, the first and second tail transistors 208 and 218 are turned off so as to disable the tail-switched sense amplifier circuit 106.

When the sampling clock CLKB transitions to a second logic state (logic low) after the sampling of the differential input signals by the sampling circuit 104, the first and second clamping transistors 220 and 222 are turned off and the first and second tail transistors 208 and 218 are turned on The actuated tail-switched sense amplifier circuit 106 then functions to amplify the sampled intermediate signals INN_INT and INP_INT and generate the intermediate differential output signals OUT_INT and OUTB_INT. The first pair of cross-coupled transistors 210 and 212 and the second pair of cross-coupled transistors 214 and 216 form back-to-back inverter circuits coupled to the differential outputs of the first and second input transistors 204 and 206. Because of the operation of the first and second clamping transistors 220 and 222 (when CLKB is logic high), the voltages at the OUT_INT and OUTB_INT signal output nodes are initially clamped to ground. However, in response to CLKB transitioning to logic low, differential currents passing through the first and second input transistors 204 and 206 start charging the OUT_INT and OUTB_INT signal output nodes in the manner of a folded cascode amplifier and initiate signal regeneration in the first stage 102. This operation to resolve the logic states at the OUT_INT and OUTB_INT signal output nodes is assisted by the latching function of the back-to-back inverter circuits formed by the first pair of cross-coupled transistors 210 and 212 and the second pair of cross-coupled transistors 214 and 216.

Reference is now made to FIG. 2B which presents a circuit diagram of an exemplary embodiment of the second stage 108 of the differential data sampler circuit 100 of FIG. 1.

The resettable linear amplifier circuit 110 of the second stage 108 includes a third input transistor 230 and a fourth input transistor 232. The third and fourth input transistors 230 and 232 are NMOS transistors. The gate terminal of the third input transistor 230 is coupled to receive the OUT_INT signal output from the first stage 102 and the gate terminal of the fourth input transistor 232 is coupled to receive the OUTB_INT signal output from the first stage. The source terminals of the third and fourth input transistors 230 and 232 are coupled together at a common tail node TAIL3. A third tail node transistor 234 is coupled between the common tail node TAIL3 and the second voltage supply node (ground). The gate of the third tail node transistor 234 is coupled to the first voltage supply node (VDD). The third and fourth input transistors 230 and 232 form a differential input pair of transistors for a differential amplifier circuit. The drain terminal of the third input transistor 230 is coupled to an output node of the differential amplifier circuit to produce the intermediate differential output signal OUTB2. The drain terminal of the fourth input transistor 232 is coupled to an output node of the differential amplifier circuit to produce the intermediate differential output signal OUT2.

The differential amplifier circuit in the second stage 108 further includes a pair of reset with linear resistance transistors 236 and 238. The transistors 236 and 238 are PMOS transistors. A drain of a first reset transistor 236 is coupled to the drain terminal of the third input transistor 230, and a drain of a second reset transistor 238 is coupled to the drain terminal of the fourth input transistor 232. The source terminals of the reset transistors 236 and 238 are coupled to the first voltage supply node (VDD). The gate terminals of the first and second reset transistors 236 and 238 are coupled to receive the sampling clock CLKB signal.

When the sampling clock CLKB is in the second logic state (logic low), the reset transistors 236 and 238 are turned on and the output of the linear amplifier circuit 110 of the second stage 108 is pulled high towards the first voltage supply (VDD). The transistors 236 and 238 act as linear resistors of the differential amplifier circuit 108. Therefore, transistors 236 and 238 work as both reset transistors and linear resistances. Thus, when CLKB is in second logic state (logic zero) the first regenerated differential voltage at OUT_INT and OUTB_INT from first stage 102 is amplified by stage 108 and produces OUT2 and OUTB2 with common mode voltage near VDD. Conversely, when the sampling clock CLKB is in the first logic state (logic high), the reset transistors 236 and 238 are turned off and the linear amplifier circuit 110 of the second stage holds the amplified voltage at OUT2 and OUTB2.

Reference is now made to FIG. 2C which presents a circuit diagram of an exemplary embodiment of the third stage 112 of the differential data sampler circuit 100 of FIG. 1.

The tail-switched sense amplifier circuit 114 of the third stage 112 includes a fifth input transistor 240 and a sixth input transistor 242. The fifth and sixth input transistors 240 and 242 are NMOS transistors. The source terminals of the fifth and sixth input transistors 240 and 242 are coupled together at a common tail node TAIL4. A fourth tail node transistor 244 is coupled between the common tail node TAIL4 and the second voltage supply node (ground). The fifth and sixth input transistors 240 and 242 form a differential input pair of transistors for a differential amplifier circuit. The drain terminal of the fifth input transistor 240 is coupled to an output node 246 of the differential amplifier circuit, and the drain terminal of the sixth input transistor 242 is coupled to an output node 248 of the differential amplifier circuit.

The differential amplifier circuit further includes a pair of load transistors 250 and 252. The load transistors 250 and 252 are PMOS transistors. A drain of a first load transistor 250 is coupled to the drain terminal of the fifth input transistor 240, and a drain of a second load transistor 252 is coupled to the drain terminal of the sixth input transistor 242. The source terminals of the load transistors 250 and 252 are coupled to the first voltage supply node (VDD). The gate terminals of the fifth input transistor 240 and load transistor 250 are coupled together to receive the OUT2 signal received from the second stage 108. The gate terminals of the sixth input transistor 242 and load transistor 252 are coupled together to receive the OUTB2 signal received from the second stage 108.

The third stage 112 further includes a first inverter circuit 260 and a second inverter circuit 262. The first inverter circuit 260 is formed of a CMOS transistor pair including a PMOS transistor 270 coupled in series with an NMOS transistor 272. A source terminal of the transistor 270 is coupled to the first voltage supply node (VDD). A source terminal of the transistor 272 is coupled to the second voltage supply node (ground). The drain terminals of the transistors 270 and 272 are coupled together at the output node DOUT. The gate terminals of the transistors 270 and 272 are coupled to intermediate node 246 and to receive the OUTB2 signal from the second stage 108. The second inverter circuit 262 is formed of a CMOS transistor pair including a PMOS transistor 274 coupled in series with an NMOS transistor 276. A source terminal of the transistor 274 is coupled to the first voltage supply node (VDD). A source terminal of the transistor 276 is coupled to the second voltage supply node (ground). The drain terminals of the transistors 274 and 276 are coupled together at the output node DOUTB. The gate terminals of the transistors 274 and 276 are coupled to intermediate node 248 and to receive the OUT2 signal from the second stage 108.

When the sampling clock CLKB is in the second logic state (logic low), the fourth tail node transistor 244 is turned off and the tail-switched sense amplifier circuit 114 of the third stage 112 is disabled. As discussed above, at this time the first regenerated differential voltage at OUT_INT and OUTB_INT from first stage 102 is amplified by stage 108 and produces OUT2 and OUTB2 with common mode voltage near VDD. When the sampling clock CLKB transitions to the first logic state (logic high), the fourth tail node transistor 244 is turned on and the tail-switched sense amplifier circuit 114 of the third stage 112 is enabled. The linear amplifier circuit 110 of the second stage functions to hold the amplified voltage at OUT2 and OUTB2. The differential currents passing through the fifth and sixth input transistors 240 and 242 start discharging the nodes 246 and 248 and initiate signal regeneration in the third stage 112 to full voltage swing levels. The transistors 240 and 242 in a cross-coupled configuration and the transistors 250 and 252 in a cross-coupled configuration form back-to-back inverter circuits coupled to the differential outputs of stage 108. The back-to-back inverter circuits function as a latching circuit operable to assist in the operation to resolve the sensed and amplified logic states at the nodes 246 and 248.

The first and second inverter circuits 260 and 262 function to isolate capacitance mismatch sensitive nodes OUT2 and OUTB2 from downstream loading (i.e., downstream of the differential outputs DOUT and DOUTB) while also improving the hold margin of downstream circuitry.

In operation, the intermediate differential output signals OUT2 and OUTB2 are first pulled high towards VDD by transistors 236 and 238 when CLKB=0. However, there is fine differential voltage that is developed between OUT2 and OUT2B due to the operation of stage 108 which acts as differential amplifier at that time functioning to amplify the signals at OUT_INT and OUTB_INT. Then, when CLKB goes to logic high, the back to back inverters in the third stage resolve the difference at OUT2 and OUTB2 to full CMOS level. The inverters function to isolate OUT2 and OUTB2 from downstream load. Because downstream devices use either DOUT and DOUTB signals, it is not preferred to provide the OUT2 and/or OUTB2 signals to downstream devices because of a capacitance mismatch. Such a mismatch is unacceptable for latch circuit operation.

FIG. 2D illustrates the interconnection of the circuits of FIGS. 2A-2C.

It will accordingly be noted that the operation of the differential data sampler circuit 100 is controlled by the phase of the sampling clock CLKB.

When the sampling clock CLKB has the first logic state (logic high), three operations with respect to the three stages of the circuit 100 occur simultaneously: a) the input sampling switch circuit 104 of the first stage 102 is activated to sample the voltages at the differential inputs INN and INP of input differential data signal onto the first and second capacitors C1 and C2; b) the tail-switched sense amplifier circuit 106 of the first stage 102 and linear amplifier circuit 110 of the second stage 108 are both disabled and reset with the voltages at the OUT_INT and OUTB_INT signal output nodes being clamped to the second voltage supply node (ground); and c) the tail-switched sense amplifier circuit 114 of the third stage 112 is enabled so as to regenerate the intermediate differential output signals OUT2 and OUTB2 from an immediately preceding cycle of the sampling clock CLKB at the differential output nodes DOUT and DOUTB.

When the sampling clock CLKB has the second logic state (logic low), three operations with respect to the three stages of the circuit 100 occur simultaneously: a) the voltages at the differential output nodes DOUT and DOUTB are made available to be sampled/processed by downsteam circuitry; b) the voltages of the sampled intermediate signals INN_INT and INP_INT (at capacitors C1 and C2) are differentially amplified by the tail-switched sense amplifier circuit 106 of the first stage 102 and linear amplifier circuit 110 of the second stage 108 to produce the intermediate differential output signals OUT2 and OUTB2; and c) the tail-switched sense amplifier circuit 114 of the third stage 112 is disabled.

Reference is now made to FIGS. 3A-3E which present waveform diagrams illustrating operation of the circuitry of FIGS. 2A-2D.

Figure 3A:
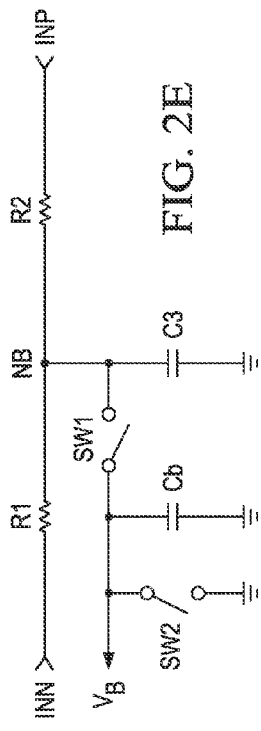
FIGS. 3A-3E are waveform diagrams illustrating operation of the circuitry of FIGS. 2A-2D.

FIG. 3A illustrates the sampling clock CLKB.

Figure 3B:
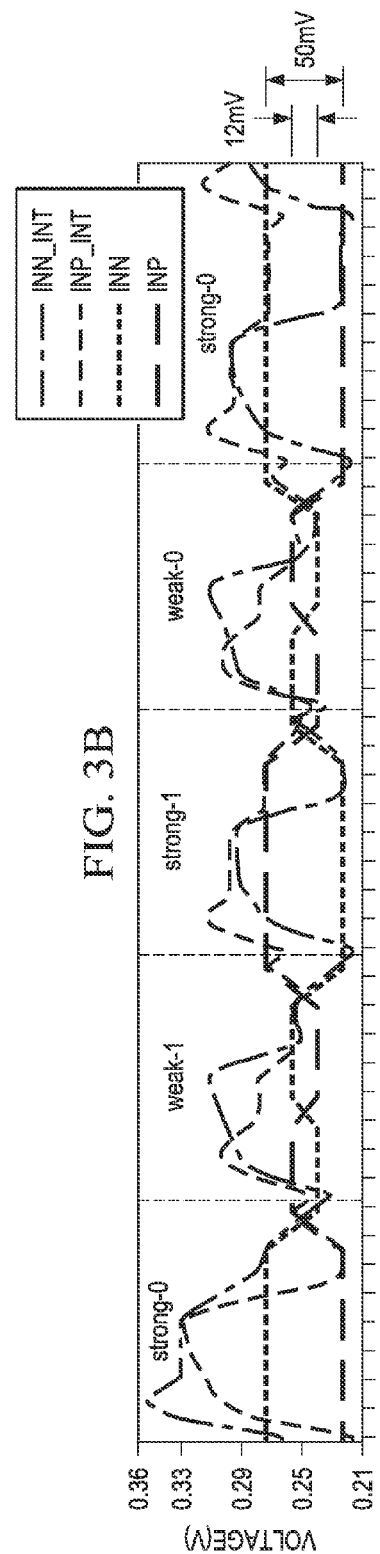

FIG. 3B illustrates the differential data signal (for example, a low voltage swing differential data signal such as a modulated data stream) received at differential inputs INN and INP. It will be noted that the received differential data is not well behaved in terms of bit width and bit height, and thus there exist instances of a "strong-0" condition (where the INN and INP signals are well separated by voltage (for example, about 50 mV) and the INN signal has a higher voltage), a "weak-1" condition (where the INN and INP signals are not well separated by voltage (for example, about 12 mV) and the INP signal has a higher voltage), a "strong-1" condition (where the INN and INP signals are well separated by voltage and the INP signal has a higher voltage), and a "weak-0" condition (where the INN and INP signals are not well separated by voltage and the INN signal has a higher voltage). The "weak-1" and "weak-0" conditions can be challenging to detect. Additionally, making those detections at sampling instants near the bit boundary can be especially challenging.

FIG. 3B further illustrates the operation of the input sampling switch circuit 104 of the first stage 102 to sample the signal received at differential inputs INN and INP to generate the sampled intermediate signals INN_INT and INP_INT.

Figure 3C:
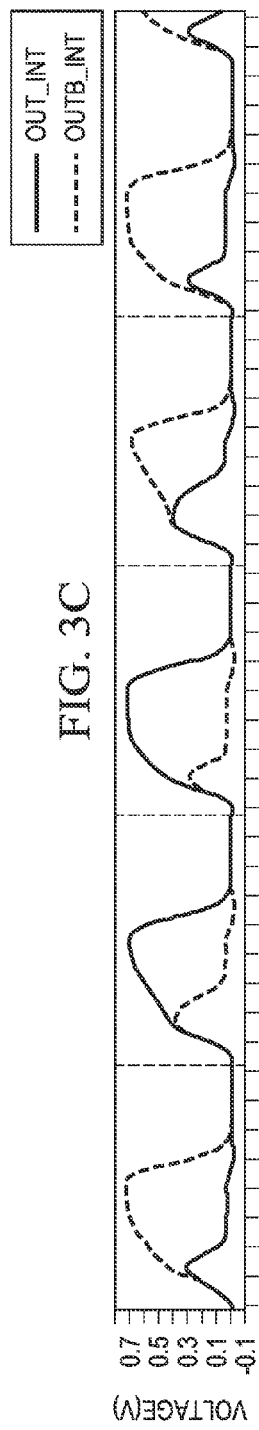

FIG. 3C illustrates operation of the tail-switched sense amplifier circuit 106 of the first stage 102 to sense and amplify the sampled intermediate signals INN_INT and INP_INT and generate the differential intermediate differential output signals OUT_INT and OUTB_INT. It will be noted that the output signals OUT_INT and OUTB_INT are both clamped to logic low when the sampling clock CLKB is logic high. When the sampling clock CLKB transitions to logic low, the tail-switched sense amplifier circuit 106 is enabled for differentially driving the outputs OUT_INT and OUTB_INT in accordance with the voltages of the sampled intermediate signals INN_INT and INP_INT.

Figure 3D:
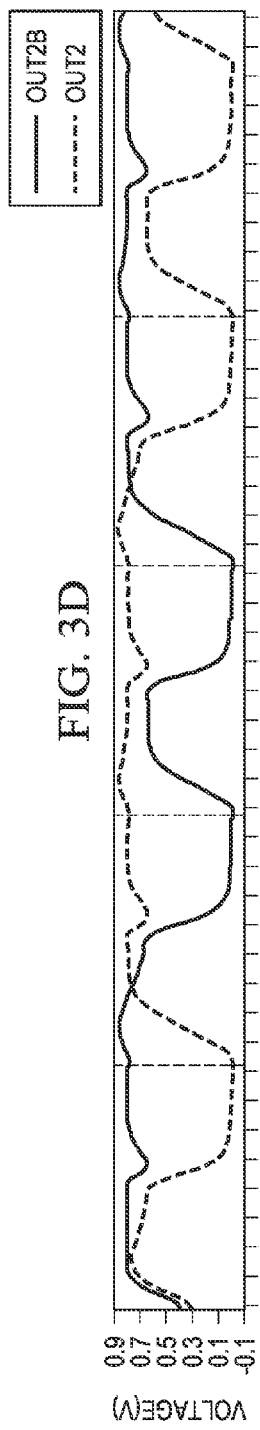

FIG. 3D illustrates operation of the resettable linear amplifier circuit 110 of the second stage 108 to amplify the signals OUT_INT and OUTB_INT and generate the intermediate differential output signals OUT2 and OUTB2. It will be noted that the intermediate differential output signals OUT2 and OUTB2 are both driven towards logic high VDD when the sampling clock CLKB is logic low. Thus, the common mode of the amplified voltages are OUT2 and OUTB2 are near VDD. When the sampling clock CLKB transitions to logic high, the linear amplifier circuit 110 holds the previously amplified differential output signals at OUT2 and OUTB2.

Figure 3E:
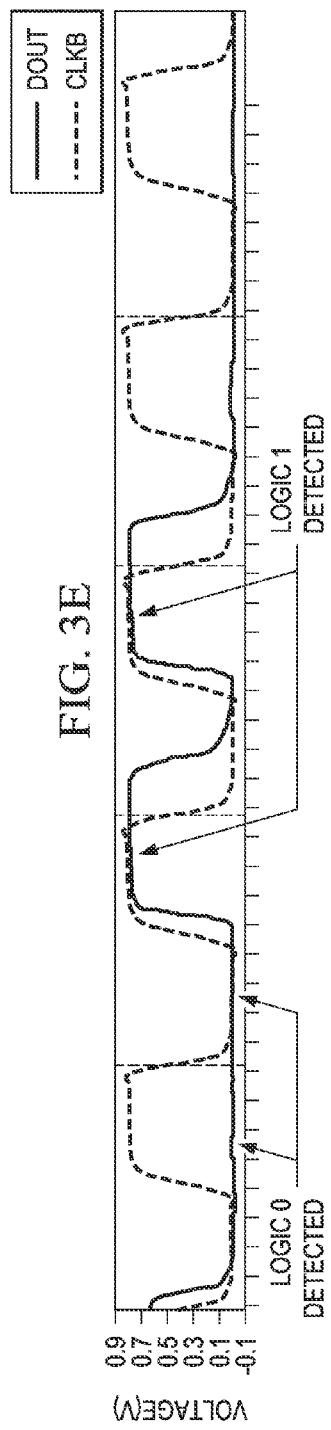

FIG. 3E illustrates operation of the third stage 112 to generate the output signal DOUT (the signal DOUTB is not illustrated but is understood to be complementary of the signal DOUT). It will be noted that the output signal DOUT is logic low when the sampling clock CLKB is logic low and when the sampled INP signal is logic low. Conversely, the output signal DOUT is logic high when the sampled INP signal has a higher voltage than the sampled INN signal. The circuit 100 accurately detected both the "weak-1" and the "strong-1" input signal states (see, FIG. 3B) to output the "logic 1 detected" pulses in the output signal DOUT resolved to full logic levels. FIG. 3D further illustrates the relative timing of the sampling clock CLKB in relation to the detected output signal DOUT.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
   a first circuit stage configured to sample a differential input signal in response to a transition of a sampling clock to a first logic state and regenerate the sampled differential input signal in response to a next immediate transition of the sampling clock to a second logic state to output a first regenerated differential signal;
   a second circuit stage configured to amplify the first regenerated differential signal in response to said next immediate transition of the sampling clock to the second logic state to output an amplified differential signal; and
   a third circuit stage configured to regenerate the amplified differential signal in response to an immediate subsequent transition of the sampling clock back to the first logic state to output a second regenerated differential signal.

2. The circuit of claim 1, wherein the first circuit stage includes a differential sampling circuit controlled by the sampling clock and including first and second capacitances for holding voltages of the sampled differential input signal.

3. The circuit of claim 2, wherein the first circuit stage further includes a tail switched sense amplifier circuit including a first tail transistor of a differential amplifier circuit, the first tail transistor having a gate terminal coupled to receive the sampling clock, the differential amplifier circuit deactivated by the first logic state of the sampling clock and activated by the second logic state of the sampling clock.

4. The circuit of claim 3, wherein the tail switched sense amplifier circuit includes a latch circuit coupled to the output of the differential amplifier circuit.

5. The circuit of claim 4, wherein the latch circuit includes a second tail transistor having a gate terminal coupled to receive the sampling clock, the latch circuit deactivated by the first logic state of the sampling clock and activated by the second logic state of the sampling clock.

6. The circuit of claim 5, wherein the latch circuit includes:
   a first pair of cross-coupled transistors; and
   a second pair of cross-coupled transistors;
   wherein the second pair of cross-coupled transistors have a common connection node coupled to the second tail transistor.

7. The circuit of claim 3, wherein the first circuit stage further includes a pair of clamp transistors coupled to the output of the differential amplifier circuit;
   wherein the clamp transistors are coupled to receive the sampling clock and are configured to clamp the output of the differential amplifier circuit towards a clamp voltage in response to the first logic state of the sampling clock.

8. The circuit of claim 1, wherein the second circuit stage comprises:
   a differential amplifier circuit;
   a pair of reset transistors coupled to an output of the differential amplifier circuit;
   wherein the reset transistors are coupled to receive the sampling clock and operate as linear resistance load devices in response to the second logic state of the sampling clock.

9. The circuit of claim 1, wherein the third circuit stage comprises a tail switched sense amplifier circuit including a tail transistor of a differential amplifier circuit, the tail transistor having a gate terminal coupled to receive the sampling clock, the differential amplifier circuit activated by the first logic state of the sampling clock and deactivated by the second logic state of the sampling clock.

10. The circuit of claim 9, wherein the tail switched sense amplifier circuit includes a latch circuit coupled to the output of the differential amplifier circuit.

11. The circuit of claim 10, wherein the third circuit stage further comprises:
    a first inverter circuit having an input coupled to a first output of the latch circuit; and
    a second inverter circuit having an input coupled to a second output of the latch circuit.

12. The circuit of claim 1, wherein the first circuit stage comprises:
    a differential sampling circuit including a first sampling transistor coupled to receive a first polarity of the differential input signal and a second sampling transistor coupled to receive a second polarity of the differential input signal.

13. The circuit of claim 12, wherein the first and second sampling transistors each include a body terminal, further comprising a bias voltage generating circuit configured to apply a bias voltage to the body terminals of the first and second sampling transistors.

14. The circuit of claim 13, wherein the bias voltage generating circuit comprises a circuit configured to detect a common mode voltage of the differential input signal and apply the common mode voltage as the bias voltage.

15. The circuit of claim 14, wherein the circuit configured to detect the common mode voltage comprises:
    a first resistance coupled to receive the first polarity of the differential input signal; and
    a second resistance coupled to receive the second polarity of the differential input signal;
    wherein the first and second resistances are connected in series at a common mode voltage node.

16. The circuit of claim 15, wherein the circuit configured to detect the common mode voltage further comprises: a first switching circuit configured to sample the common mode voltage from the common mode voltage node and store the sampled common mode voltage on a storage capacitance.

17. The circuit of claim 16, wherein the bias voltage generating circuit further comprises: a second switching circuit configured to apply a supply voltage to the body terminals of the first and second sampling transistors instead of the common mode voltage.

18. A method, comprising:
    sampling a differential input signal in response to a transition of a sampling clock to a first logic state;
    regenerating the sampled differential input signal in response to a next immediate transition of the sampling clock to a second logic state to output a first regenerated differential signal;
    amplifying the first regenerated differential signal in response to said next immediate transition of the sampling clock to the second logic state to output an amplified differential signal; and
    regenerating the amplified differential signal in response to an immediate subsequent transition of the sampling clock back to the first logic state to output a second regenerated differential signal.

19. The method of claim 18, wherein regenerating the sampled differential input signal comprises differentially amplifying, and wherein differential amplification is deactivated by the first logic state of the sampling clock and activated by the second logic state of the sampling clock.

20. The method of claim 19, further including latching an output of the differential amplification.

21. The method of claim 20, wherein latching is deactivated by the first logic state of the sampling clock and activated by the second logic state of the sampling clock.

22. The method of claim 19, further comprising clamping differential amplification outputs towards a clamp voltage in response to the first logic state of the sampling clock.

23. The method of claim 18, wherein amplifying the first regenerated differential signal comprises resetting differential amplifier output toward a reset voltage in response to the second logic state of the sampling clock.

24. The method of claim 18, wherein regenerating the amplified differential signal comprises differentially amplifying, and wherein differential amplification is activated by the first logic state of the sampling clock and deactivated by the second logic state of the sampling clock.

25. The method of claim 24, further including latching an output of the differential amplification.

26. The method of claim 25, further comprising:
inverting a first output of the latching; and
inverting a second output of the latching.

27. The method of claim 18, wherein sampling the differential input signal comprises sampling with a sampling transistor, further comprising biasing a body terminal of the sampling transistor with a bias voltage derived from a common mode voltage of the differential input signal.

28. The method of claim 27, further comprising: sampling the common mode voltage and storing the sampled common mode voltage on a storage capacitance.

29. The method of claim 28, further comprising selectively applying a reference supply voltage to the body terminals of the sampling transistor instead of the sampled common mode voltage.

* * * * *